US012561491B2

(12) United States Patent
Song et al.

(10) Patent No.: US 12,561,491 B2
(45) Date of Patent: Feb. 24, 2026

(54) AUXILIARY METHOD FOR GRAPHIC HOME IMPROVEMENT DESIGN

(71) Applicant: HANGZHOU QUNHE INFORMATION TECHNOLOGY CO., LTD., Hangzhou (CN)

(72) Inventors: Lu Song, Hangzhou (CN); Rui Tang, Hangzhou (CN); Zhi Huang, Hangzhou (CN)

(73) Assignee: HANGZHOU QUNHE INFORMATION TECHNOLOGY CO., LTD., Hangzhou (CN)

( * ) Notice: Subject to any disclaimer, the term of this patent is extended or adjusted under 35 U.S.C. 154(b) by 990 days.

(21) Appl. No.: 17/639,567

(22) PCT Filed: Mar. 31, 2021

(86) PCT No.: PCT/CN2021/084729
§ 371 (c)(1),
(2) Date: Mar. 1, 2022

(87) PCT Pub. No.: WO2021/244119
PCT Pub. Date: Dec. 9, 2021

(65) Prior Publication Data
US 2022/0300669 A1 Sep. 22, 2022

(30) Foreign Application Priority Data
Jun. 5, 2020 (CN) .......................... 202010503472.4

(51) Int. Cl.
*G06F 30/13* (2020.01)
*G06T 19/20* (2011.01)
(52) U.S. Cl.
CPC .............. *G06F 30/13* (2020.01); *G06T 19/20* (2013.01); *G06T 2200/08* (2013.01)

(58) Field of Classification Search
CPC ...... G06F 30/13; G06T 19/20; G06T 2200/08
See application file for complete search history.

(56) References Cited

U.S. PATENT DOCUMENTS

2017/0214899 A1* 7/2017 Meier ........................ G06T 7/73
2018/0189974 A1* 7/2018 Clark ........................ G06N 3/04
(Continued)

FOREIGN PATENT DOCUMENTS

| CN | 106295052 | 1/2017 |
| CN | 107239997 | 6/2017 |

(Continued)

OTHER PUBLICATIONS

Jie Zhu, NPL, "A Data-Driven Approach for Furniture and Indoor Scene Colorization", Published Sep. 2018 (Year: 2018).*
(Continued)

*Primary Examiner* — Rehana Perveen
*Assistant Examiner* — Angel Calle
(74) *Attorney, Agent, or Firm* — Jiwen Chen; Joywin IP Law PLLC

(57) ABSTRACT

An auxiliary method for graphic home improvement design includes the following steps: (1) acquiring the rendered image as the graphic home improvement background image, and at the same time acquire camera parameters and depth information of the rendered image; (2) constructing a transform matrix between the projection plane coordinate system and the world coordinate system according to the camera parameters, and construct a three-dimensional model corresponding to the plane home improvement background image according to the transform matrix; (3) selecting the target position of the home improvement material on the graphic home improvement background map, place the home improvement material at the target position according to the three-dimensional space constraint conditions correspond-
(Continued)

S701
Acquire a real-shot photo of the hard-installation of the house as the graphic home improvement background image S702
Detect plane intersection lines in the graphic home improvement background image to construct a three-dimensional model corresponding to the graphic home improvement background image S703
Add physical dimensions according to the three-dimensional model, and determine camera parameters, depth information, and transform matrix between the projection plane coordinate system and the world coordinate system S704
Select the target position of the home improvement material on the graphic home improvement background map, place the home improvement material at the target position according to the three-dimensional space constraint conditions corresponding to the type of home improvement material, and at the same time transform the home improvement material from the physical size to the projected size according to the target position and depth information, so as to realize the auxiliary design of graphic home improvement ing to the type of home improvement material, and at the same time transform the home improvement material from the physical size to the projected size according to the target position and depth information.

3 Claims, 5 Drawing Sheets

(56)                References Cited

U.S. PATENT DOCUMENTS

| | | |
|---|---|---|
| 2018/0374276 A1 | 12/2018 | Powers et al. |
| 2020/0302681 A1* | 9/2020 | Totty ......................... G06T 7/74 |

FOREIGN PATENT DOCUMENTS

| | | |
|---|---|---|
| CN | 109461210 | 3/2019 |
| CN | 109598783 | 4/2019 |
| CN | 110929310 | 3/2020 |

OTHER PUBLICATIONS

Sashank Sridhar, NPL, "Instant Tracking-Based Approach for Interior Decor Planning with Markerless AR", Published May 27, 2020 (Year: 2020).*

* cited by examiner

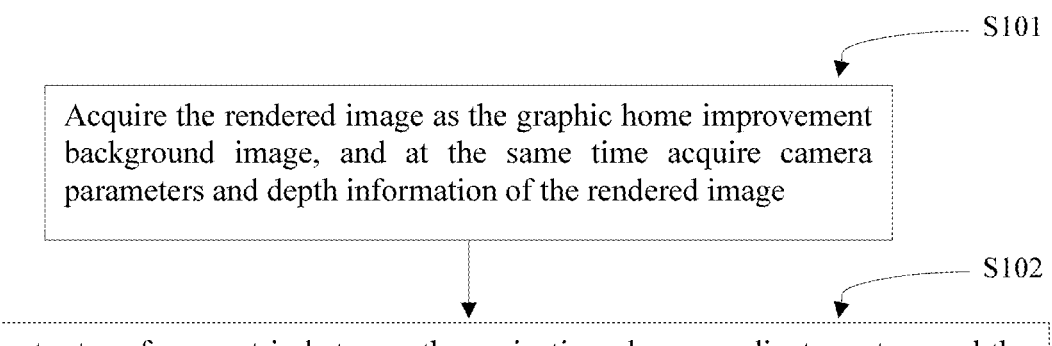

Acquire the rendered image as the graphic home improvement background image, and at the same time acquire camera parameters and depth information of the rendered image Construct a transform matrix between the projection plane coordinate system and the world coordinate system according to the camera parameters, and construct a three-dimensional model corresponding to the plane home improvement background image according to the transform matrix Select the target position of the home improvement material on the graphic home improvement background map, place the home improvement material at the target position according to the three-dimensional space constraint conditions corresponding to the type of home improvement material, and at the same time transform the home improvement material from the physical size to the projected size according to the target position and depth information, so as to realize the auxiliary design of graphic home improvement

Figure 1

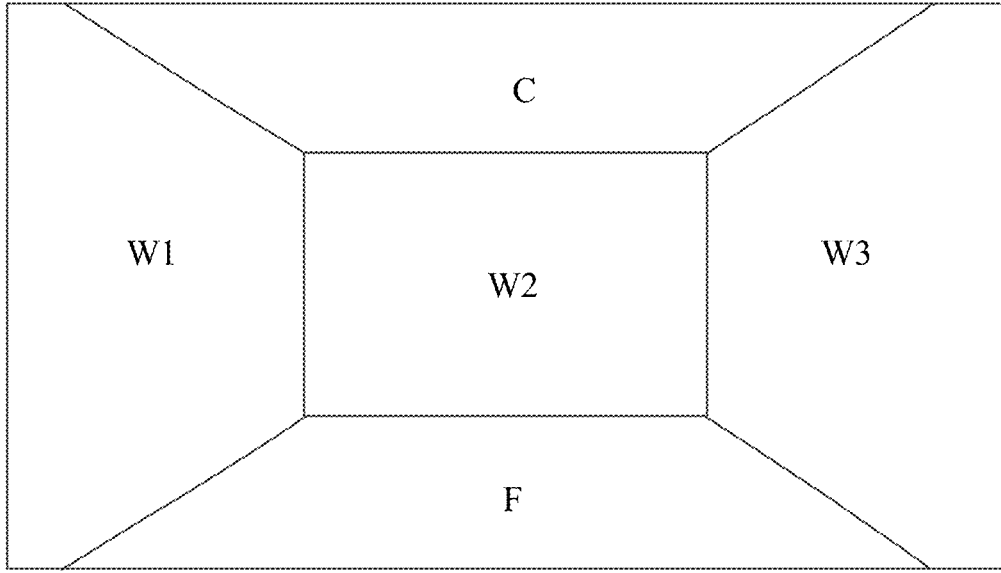

Figure 2

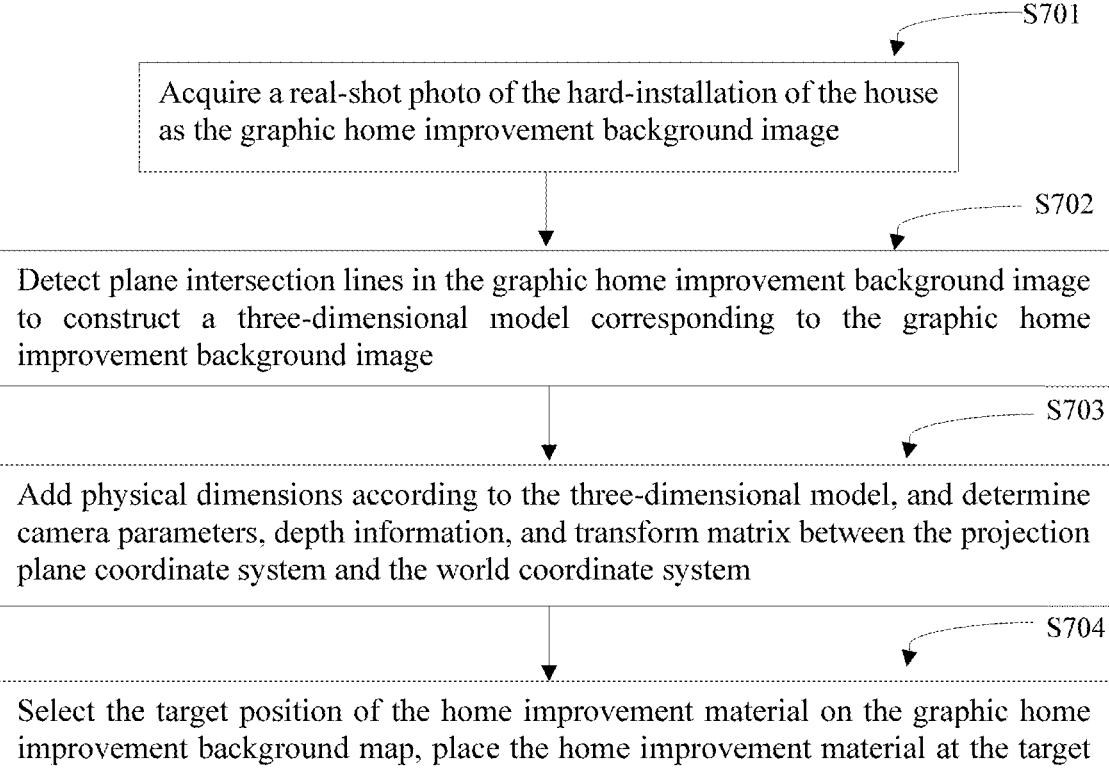

S701

Acquire a real-shot photo of the hard-installation of the house as the graphic home improvement background image

S702

Detect plane intersection lines in the graphic home improvement background image to construct a three-dimensional model corresponding to the graphic home improvement background image

S703

Add physical dimensions according to the three-dimensional model, and determine camera parameters, depth information, and transform matrix between the projection plane coordinate system and the world coordinate system

S704

Select the target position of the home improvement material on the graphic home improvement background map, place the home improvement material at the target position according to the three-dimensional space constraint conditions corresponding to the type of home improvement material, and at the same time transform the home improvement material from the physical size to the projected size according to the target position and depth information, so as to realize the auxiliary design of graphic home improvement

Figure 7

AUXILIARY METHOD FOR GRAPHIC HOME IMPROVEMENT DESIGN

This is a U.S. national stage application of PCT Application No. PCT/CN2021/084729 under 35 U.S.C. 371, filed Mar. 31, 2021 in Chinese, claiming priority to Chinese Patent Applications No. 202010503472.4 filed Jun. 5, 2020, all of which are hereby incorporated by reference.

TECHNICAL FIELD

The invention relates to the intersecting field of home improvement design and computer-aided design, in particular to an auxiliary method for graphic home improvement design.

BACKGROUND TECHNOLOGY

Home improvement design generally includes hard decoration, customization and soft decoration. Now the delivery of fine decoration is the general trend of social development, where the house owner acquires a house that has been uniformly and hard-installed by the developer. The home improvement design can be completed by part of the hard decoration and auxiliary furnishings, which best reflects the character and preferences of the house owner.

Soft decoration is an emerging concept in recent years, which has further subdivided the field of home improvement. The so-called soft decoration refers to use the accessories that are easy to replace and change positions such as wallpaper, fabrics, carpets, furniture, ornaments, decorative lightings, plants, etc. to make second-degree furnishings and layouts to the house. In other words, it means that in addition to the fixed and immovable decorations in the house, such as the floor, ceiling, wall, doors and windows, other movable and easy-to-replace decorations are the second-degree furnishings and layouts of the house.

With the improvement of people's living standards, the individual demand for soft decoration design has become more and more obvious. People usually determine their favorite style, color system and specific soft decorations through professional soft decoration designers, shopping guides in home furnishing stores, or simple matching by themselves, and then purchase and place them. However, the existing soft decoration design tools, such as Meijian, Microsoft PowerPoint, Adobe photoshop, etc., are often not intelligent and convenient enough. Users have to determine the size, position, and deformation of the soft decoration materials by themselves, especially in the scene of perspective relationship, significant amount of time is spent on the deformation of the material. However, 3D design tools, such as 3D max, are too expensive and difficult for ordinary users to learn, so it is difficult to popularize. Some Internet 3D design tools, such as Kujiale, Three-dimensional Home, and Tangping Designer, in most cases, require users to go through the steps of drawing house type, hard installation design, and customization before starting the soft decoration design. The pre-steps are too long and cumbersome, so it is difficult to meet the current trend of refined decoration delivery and personalized soft outfits.

The invention patent application with application publication number CN106295052A discloses a mutual aid home improvement design system, and the invention patent application with application publication number CN107239997A discloses a self-service furniture home improvement design system, both of which are based on three-dimensional models for home improvement design, which is of low efficiency.

SUMMARY OF INVENTION

The object of the present invention is to provide a graphic home improvement design auxiliary method to improve the efficiency of home improvement design.

In order to achieve the above-mentioned purpose of the invention, the present invention provides a graphic home improvement design auxiliary method, including the following steps:

Acquiring the rendered image as the graphic home improvement background image, and at the same time acquire camera parameters and depth information of the rendered image; wherein the graphic home improvement background image is a plan view that includes at least one projection plane of a floor projection plane, a wall projection plane, and a ceiling projection plane;

Constructing a transform matrix between the projection plane coordinate system and the world coordinate system according to the camera parameters, and constructing a three-dimensional model corresponding to the plane home improvement background image according to the transform matrix;

Selecting the target position of the home improvement material on the graphic home improvement background map, placing the home improvement material at the target position according to the three-dimensional space constraint conditions corresponding to the type of home improvement material, and at the same time transforming the home improvement material from the physical size to the projected size according to the target position and depth information, so as to realize the auxiliary design of graphic home improvement.

In order to achieve the above-mentioned purpose of the invention, the present invention provides a graphic home improvement design auxiliary method, including the following steps:

Acquiring a real-shot photo of the hard-installation of the house as the graphic home improvement background image, which is a plan view that includes at least one projection plane of a floor projection plane, a wall projection plane, and a ceiling projection plane;

Detecting plane intersection lines in the graphic home improvement background image to construct a three-dimensional model corresponding to the graphic home improvement background image;

Adding physical dimensions according to the three-dimensional model, and determining camera parameters, depth information, and transforming matrix between the projection plane coordinate system and the world coordinate system;

Selecting the target position of the home improvement material on the graphic home improvement background map, placing the home improvement material at the target position according to the three-dimensional space constraint conditions corresponding to the type of home improvement material, and at the same time transforming the home improvement material from the physical size to the projected size according to the target position and depth information, so as to realize the auxiliary design of graphic home improvement.

Compared with the prior technique, the beneficial effects of the present invention include at least:

In the graphic home improvement design auxiliary method provided by the embodiment of the present invention, by building a three-dimensional model of the graphic home improvement background image, when the home improvement materials are placed on the graphic home improvement background image, auxiliary constraint conditions are performed according to the types of the home improvement materials and the three-dimensional space constraint conditions, so as to realize the automatic adjustment of the size, position and angle of the home improvement material, thus greatly improving the efficiency of home improvement design.

BRIEF DESCRIPTION OF DRAWINGS

In order to explain the embodiments of the present invention or the technical solutions in the prior technique more clearly, the drawings that need to be used in the description of the embodiments or the prior technique will be briefed introduced. Obviously, the drawings in the following description are only some embodiments of the present invention. For those of ordinary skill in the field, other drawings can be obtained based on these drawings without creative work.

FIG. 1 is a flowchart of an embodiment of a graphic home improvement design auxiliary method provided by the present invention;

FIG. 2 is an example of a graphic home improvement background image provided by the present invention;

FIG. 7 is a flowchart of another embodiment of a graphic home improvement design auxiliary method provided by the present invention.

DETAILED DESCRIPTION OF THE EMBODIMENTS

Figure 3:
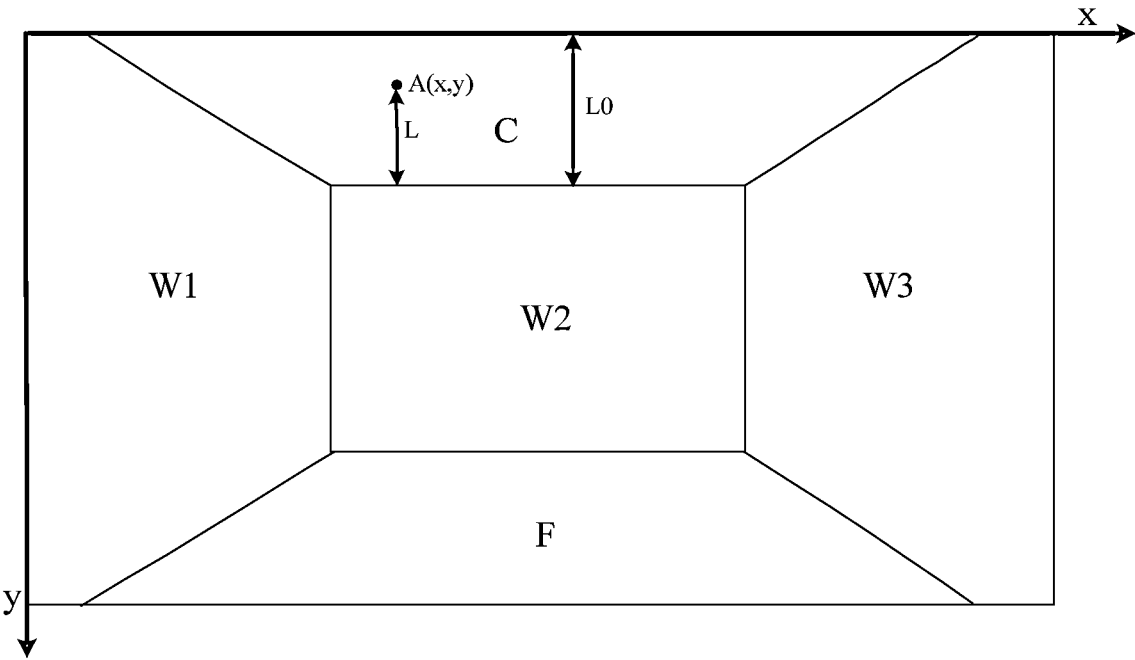
FIG. 3 is an example of the homogeneous coordinates of the projection plane of each point in the projection plane provided by the present invention.

In order to make the purpose, technical solutions, and advantages of the present invention clearer, the following further describes the invention in detail with reference to the figures and embodiments. It should be understood that the specific embodiments described herein are only used to explain the present invention, and do not limit the protection scope of the present invention.

In order to solve the problem of low efficiency or lengthy pre-steps of the existing graphic home improvement design, and to improve the efficiency of the graphic home improvement design, an embodiment of the present invention provides an auxiliary method for the graphic home improvement design.

FIG. 1 is a flow chart of an embodiment of a graphic home improvement design auxiliary method provided by the present invention. The graphic home improvement design auxiliary method shown in FIG. 1 uses the rendered image as the background image of the graphic home improvement. As shown in FIG. 1, the graphic home improvement design auxiliary method includes the following steps:

S101: Acquiring a rendered image as the home improvement background image, and acquiring camera parameters as well as depth information of the rendered image at the same time.

The graphic home improvement background image is the initial input picture of the graphic home improvement design, that is, the home improvement material is designed on the graphic home improvement background image. In general, in order to display the overall effect when designing the home improvement, the graphic home improvement background image adopts a projection plane from the current perspective, that is, the graphic home improvement background image includes at least one plane image among floor projection plane, wall projection plane and ceiling projection plane. FIG. 2 exemplarily shows a graphic home improvement background image, which includes a floor projection plane F, wall projection planes W1, W2, W3, and a ceiling projection plane C.

Among them, the rendered image includes home improvement design rendered image with depth information and camera parameters as well as blank scene rendered image;

For the rendered image with dept information and camera parameters, directly obtaining the camera parameters and depth information from the rendered image; analyzing the rendered image, separating the soft decoration elements as home improvement materials, and re-rendering the rest as the graphic home improvement background image;

The blank scene rendered image is directly used as the graphic home improvement background image, using preset camera parameters and depth information.

In the embodiment, the separated soft decoration elements are used as plane rendered image in a manner that each layer carries a current perspective. During the design, the plane rendered image is directly used as the preset home improvement material.

Home improvement materials are soft decoration or part of the hard decoration that are selected to decorate the interior layout during the design. These home improvement materials can be categorized into three-dimensional home improvement materials and two-dimensional home improvement materials. The three-dimensional home improvement materials are generally stored in a material library, and include a three-dimensional model of the home improvement materials and plane rendered images from any angle of view. In the design process, three-dimensional home improvement materials are generally replaced by plane rendered image with default angles. In addition to the two-dimensional home improvement materials stored in the material library, generally they are uploaded by the designer themselves. In the design process, two-dimensional home improvement materials are directly used as graphic home improvement materials.

According to the shape of the home improvement materials, they can be categorized into graphic home improvement materials and three-dimensional home improvement materials. Among them, the graphic home improvement materials include carpets, murals, tablecloths, etc., and the three-dimensional home improvement materials include tables, chairs, cabinets, plants, sofas, air conditioners, lamps, etc. According to the placement method, three-dimensional home improvement materials can be categorized into placed three-dimensional-materials that can be placed on the floor directly and hanging three-dimensional-materials that should be hung. Placed three-dimensional home improvement materials include tables, sofas, etc., which can be placed on the floor directly at the default angle. Hanging three-dimensional home improvement materials include hanging lights, hanging air conditioners, range hoods, etc., which should be rotated to hang on the wall or ceiling at an angle where the materials' back is attached to the wall.

S102: Constructing a transform matrix between the projection plane coordinate system and the world coordinate system according to the camera parameters, and constructing a three-dimensional model corresponding to the plane home improvement background image according to the transform matrix.

In the embodiment, the construction method of the transform matrix between the projection plane coordinate system and the world coordinate system is:

Calculating the transform matrix from the camera coordinate system to the world coordinate system according to the camera parameters, $$v = TRv''$$

Among them, v is the world coordinate system coordinates, $v''$ is the camera coordinate system coordinates, R is the rotation transform matrix and R is the orthogonal matrix, T is the translation transform matrix, then $v'' = R^T T^{-1} v$, in this way, the mutual transform relationship between the world coordinate system and the camera coordinate system is obtained;

Calculating the transformation relationship between the projection coordinate system and the camera coordinate system, $$u = Pv''$$

Among them, P is the projection matrix, u=(x, y, z, w) is the homogeneous coordinates of the projection plane, where w=1, z is the depth of the projection plane, (x, y) is the two-dimensional coordinates of the projection plane, then $v'' = P^{-1}u$;

Comprehensively, the conversion relationship between the projected plane coordinates and the world coordinate system can be obtained:

$$u = Mv$$

Among them, $M = PR^T T^{-1}$ is the transform matrix between the projection plane coordinate system and the world coordinate system, then $v = M^{-1}u$. In this way, as long as the homogeneous coordinates of the projection plane of a point are given, the world coordinates of the point can be calculated according to $v = M^{-1}u$.

The graphic home improvement background image is a projection plane obtained by rendering with known camera parameters and depth information. The depth z of each point in the projection plane can be obtained directly according to the plane size ratio relationship, and combined with the two-dimensional coordinates (x, y) of each point in the projection plane, the homogeneous coordinate u=(x, y, z, w) of each point on the projection plane can be obtained. According to $v = M^{-1}u$, the world coordinates of each point can be calculated. Finally, according to the world coordinates of each point, the three-dimensional model corresponding to the graphic home improvement background image can be obtained.

FIG. 3 is an example figure of the homogeneous coordinates u=(x, y, z, w) of the projection plane for constructing each point in the projection plane. It is assumed that the upper left corner is selected as the origin, and downward is defined as the positive direction of the y-axis, and the rightward is the positive direction of the x-axis to construct the coordinate system on the image. Point A is a point on the ceiling projection plane, then the two-dimensional coordinates of point A on the image are (x, y). The distance from point A to boundary line of the wall projection plane W2 and the ceiling projection plane C is L. The distance from the boundary line of the wall projection plane W2 and the ceiling projection plane C to the x-axis is L0. The depth corresponding to L0 is the distance Z0 from the camera to the wall responding to the projection plane W2. Then the depth corresponding to point A is $$z = \frac{L}{L0} \times Z0,$$

so that the homogeneous coordinates of point A in the projection plane $$u = \left(x, y, \frac{L}{L0} \times Z0, 1\right)$$

can be obtained. It should be noted that the plane K parallel to the wall projection plane W2 where the point A is located has the same size in the three-dimensional space as the projection plane W2 parallel to the wall surface, but the depths of the points on the plane are different.

S103: Selecting the target position of the home improvement material on the graphic home improvement background map, placing the home improvement material at the target position according to the three-dimensional space constraint conditions corresponding to the type of home improvement material, and at the same time transforming the home improvement material from the physical size to the projected size according to the target position and depth information, so as to realize the auxiliary design of graphic home improvement.

In the design process, first selecting the home improvement materials that need to be placed and the target position where the home improvement materials are placed.

The target position can be any point on the graphic home improvement background image. According to the selected target position, the secondary coordinates u=(x, y, z, w) of the target position in the projection plane are calculated, and then the world coordinates of the target position can be calculated according to the transform matrix between the projection plane coordinate system and the world coordinate system.

In the physical world, the actual home improvement materials will not be suspended in the air or embedded in the wall or the floor due to gravity constraints and space collision constraints. Therefore, in order to improve the design rate and sense of realism, three-dimensional space constraints are provided. This three-dimensional space constraints correspond to the types of home improvement materials. Different types of home improvement materials correspond to different three-dimensional space constraints. When placing home improvement materials, the home improvement materials are automatically placed at the target position according to the three-dimensional space constraints corresponding to the type of home improvement materials.

In an embodiment, the three-dimensional space constraint conditions corresponding to the type of the home improvement material for placing the home improvement material at the target position includes:

For graphic home improvement materials, the corresponding three-dimensional space constraint condition is to be attached to the projection plane. Therefore, when the home improvement materials are placed, they are directly attached to the target position;

For placed 3D home improvement materials and suspended 3D home improvement materials, the corresponding three-dimensional space constraint is to be placed on the projection plane. Therefore, when such home improvement materials are placed, they are directly placed in contact with the target position.

Of course, in some possible implementation methods, the three-dimensional space constraint condition can also be cancelled according to the user's choice. By default, the three-dimensional space constraint condition is included when the home improvement material is placed.

After the home improvement material is placed in the target position, the projection size of the home improvement material needs to be adjusted. When adjusting, the projection size is mainly calculated based on the target position and depth information and the physical size of the home improvement materials.

For three-dimensional home improvement materials, the physical size of the home improvement materials is known and can be obtained directly. For two-dimensional home improvement materials, the default physical size will be designed according to the type of home improvement materials. For example, the default height of the sofa is 800 mm, and the default height of the floor lamp is 1600 mm.

In an embodiment, transforming the home improvement material from a physical size to a projection size according to the target position and depth information includes:

calculating the world coordinates of home improvement materials according to the target position and depth information;

transforming the world coordinates of the home improvement materials to the projection coordinates of the projection plane;

taking the target position of the home improvement material as the dividing line, taking the part of the home improvement material that increases the depth value along the depth direction as the sampling part, and sampling the different levels of pixel points along the depth direction according to the projection coordinates to reduce the size;

taking the target position of the home improvement material as the dividing line, taking the part of the home improvement material that decreases the depth value along the depth direction as the interpolation part, and performing the interpolation of different levels of pixel points along the depth direction according to the projection coordinates in order to increase the size. At this point, the home improvement material is transformed from physical size to projection size. When transforming the size of home improvement materials, select a reference plane, which can be any projection plane, such as a wall projection plane, or a plane parallel to the projection plane, such as a plane parallel to the wall projection plane. The choice of the reference plane takes the convenience of calculation as the main consideration, and the others are not restricted.

In the embodiment, the target placement position on the wall projection plane is defined as the center point of the home improvement material. For example, when the hanging picture is placed at the target position on the wall projection plane, it is expected that the centroid of the hanging picture is located at the specified target position.

The target position of the floor projection plane or the ceiling projection plane is defined as the center point of the contact between the home improvement material and the projection plane. For example, when placing a sofa, the target position is the center point of the bottom surface of the sofa, and when placing a hanging light, the target position is the center point of the top of the ceiling.

Since the selected target position is a point, while the home improvement material is a flat image, the pixel range is obtained according to the target position and the size of the home improvement material on the reference plane. For example, the target position is (x0, y0), and the size of the reference plane is (w, h) on the wall projection plane, then the position range of the picture on the reference plane is (x0−w/2,y0−h/2)~(x0+w/2,y0+h/2).

According to the method in S102, the world coordinates of the target position are calculated on the premise that the target position and depth information are known. When the world coordinates of the target position are obtained, the world coordinates of the home improvement materials can be obtained according to the positional relationship between the target position and the home improvement materials, and the physical size of the home improvement materials.

Then, according to the relationship between the world coordinate system and the projection coordinate system, the world coordinates of the home improvement material are transformed to obtain the projection coordinates of the home improvement material. In this way, the projection size of the home improvement material is initially obtained.

On the basis of obtaining the projection size of the home improvement material, in order to present the home improvement material in a perspective relationship to enhance the realism of the home improvement material, it is necessary to adjust the projection size of the home improvement material. The home improvement material can be divided into a sampling part and interpolation part and the specific division is based on the change of the depth value in the depth direction. The depth value is the depth value calculated in the camera coordinate system with the camera as the origin.

Specifically, taking the target position of the home improvement material as the dividing line, for the home improvement material on the side where depth value increases along the depth direction, that is, the half of the home improvement material that is farther from the camera, in order to achieve the perspective relationship of closer-larger and further-smaller, the half of the home improvement material needs to be sampled at different levels. The larger the depth value, the less the number of samples, so as to gradually reduce the size along the vertical direction of the depth direction.

Similarly, taking the target position of the home improvement material as the dividing line, for the home improvement material on the side where depth value decreases along the depth direction, that is, the half of the home improvement material that is closer to the camera, in order to achieve a perspective relationship of closer-larger and further-smaller, the half of the home improvement materials needs to be interpolated at different levels. The smaller the depth value, the more the number of interpolations, so as to gradually increase the size along the vertical direction of the depth direction. In this way, the transformation of home improvement materials from physical size to projection size is completed, and the realism of the perspective of closer-larger and further-smaller can be presented.

Figure 4:
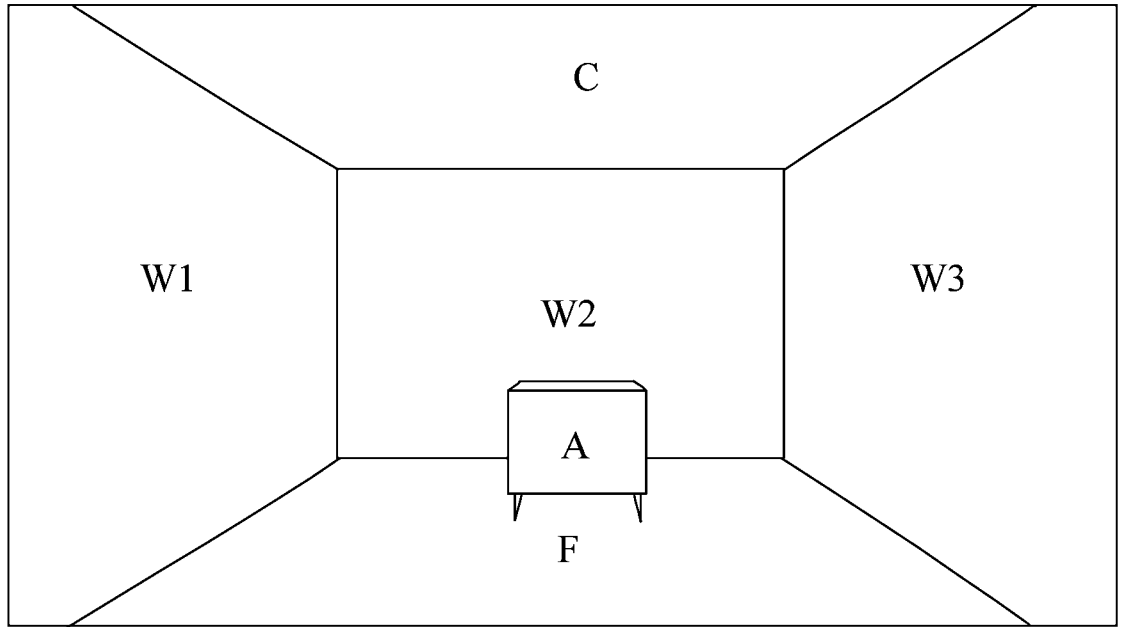
FIGS. 4(a) and 4(b) are examples of the three-dimensional home improvement material table provided by the present invention being placed on the floor projection plane, showing an example of a realism of the perspective of closer-larger and further-smaller.
Figure 4:
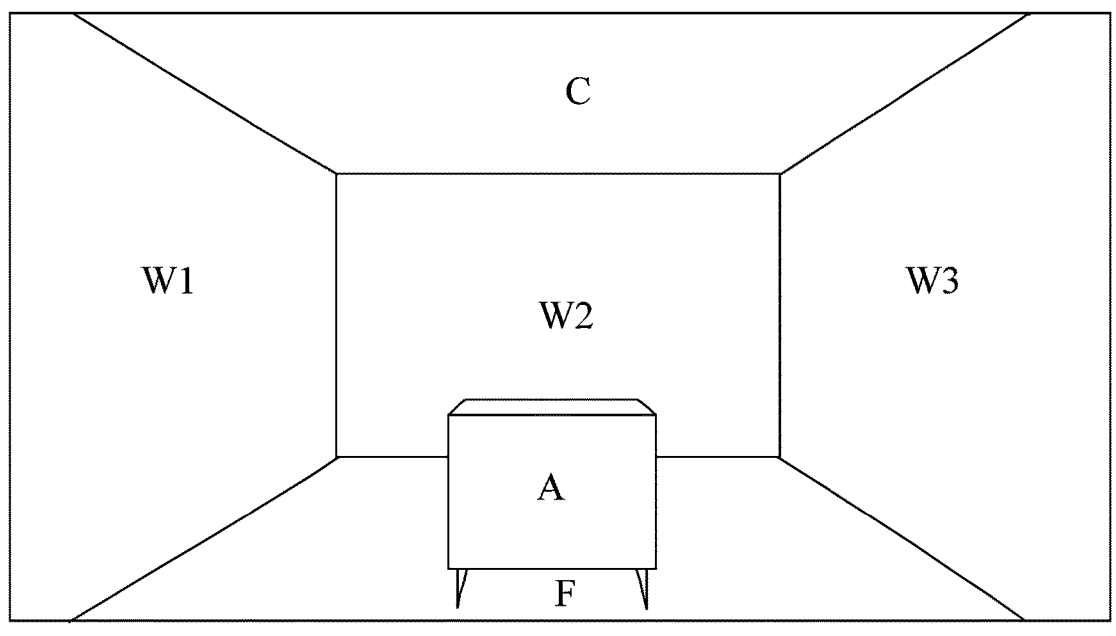
Figure 5:
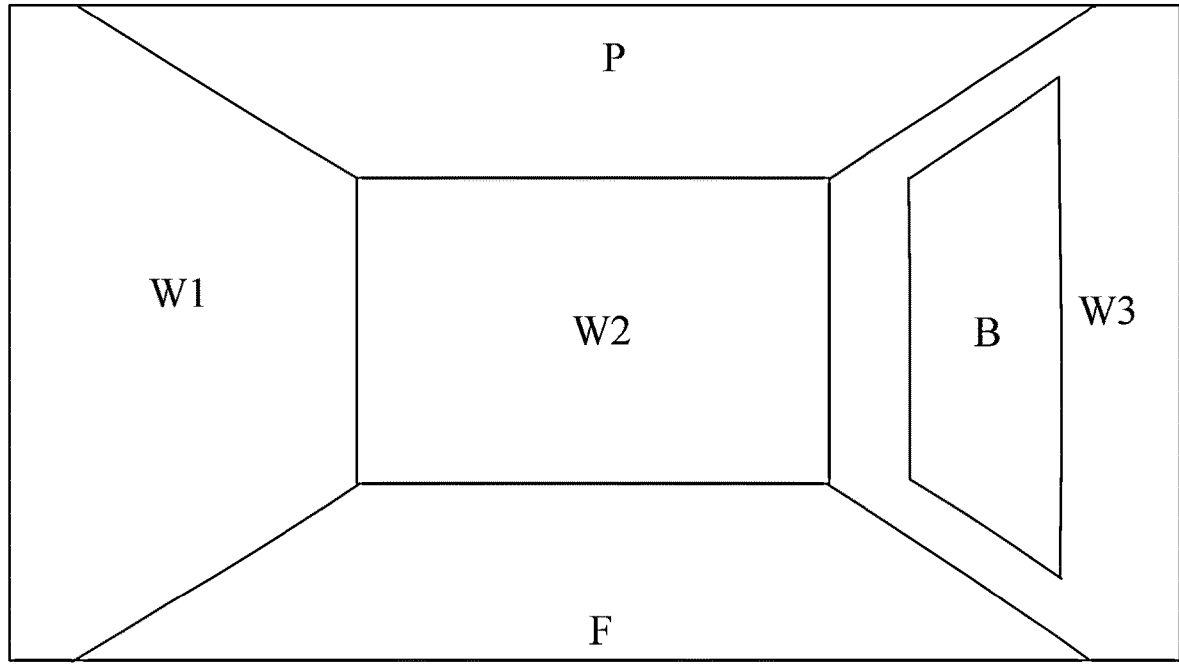
FIG. 5 is an example of a hanging picture provided by the present invention being placed on the projection plane of the wall to show the realism of the perspective of closer-larger and further-smaller.

In another embodiment, in order to prevent the distortion of the home improvement material presenting a perspective effect, perspective transform is performed on the high-definition image of the home improvement material directly according to the perspective transform matrix of the reference coordinate system and the projection coordinate system to adjust the projection size of the home improvement material. FIG. 4(a) and FIG. 4(b) exemplarily show the three-dimensional home improvement material table A is placed on the floor projection plane with the realism of the perspective of closer-larger and further smaller. FIG. 5 exemplarily shows the graphic home improvement material, the hanging picture B, is placed on the wall projection plane with the realism of the perspective of closer-larger and further-smaller. The realism of the perspective of the hanging picture is consistent with the realism of the perspective of the placed wall's projection plane.

Wherein, the transformation of the world coordinates of the home improvement materials to the projection coordinates of the projection plane includes:

Method 1: According to the conversion matrix of the world coordinate system and the reference coordinate system, transforming the world coordinates of the home improvement materials to obtain the reference coordinates of the home improvement materials; then according to the perspective transform matrix between the reference coordinate system and the projection coordinate system, transforming the reference coordinates of the home improvement materials to obtain the projection coordinates of the home improvement materials; or, Method 2: According to the transform matrix between the projection plane coordinate system and the world coordinate system, changing the world coordinates of the home improvement materials to obtain the projection coordinates of the home improvement materials.

In Method 1, the conversion matrix between the world coordinate system and the reference coordinate system is determined according to the correspondence between the physical size of the home improvement material in the world space and the pixel size on the reference plane. The perspective transform matrix of the reference coordinate system and the projection coordinate system is determined according to the perspective relationship between the reference plane and the projection plane. In Method 2, the transform matrix between the projection plane coordinate system and the world coordinate system is the matrix M in S102.

In another embodiment, when the three-dimensional home improvement materials need to be placed back against the wall projection plane, the home improvement materials close to the wall projection plane are automatically rotated and placed back against the wall projection plane according to the rotation angle corresponding to the wall projection plane.

In the design process, when the selected home improvement material is three-dimensional, the area not close to the wall is generally placed at the default angle, and the area close to the wall is automatically rotated to the angle at which the back is placed against the wall. During the rotation, the home improvement materials close to the wall projection plane are rotated and placed back against the wall projection plane according to the rotation angle corresponding to the wall projection plane.

Figure 6:
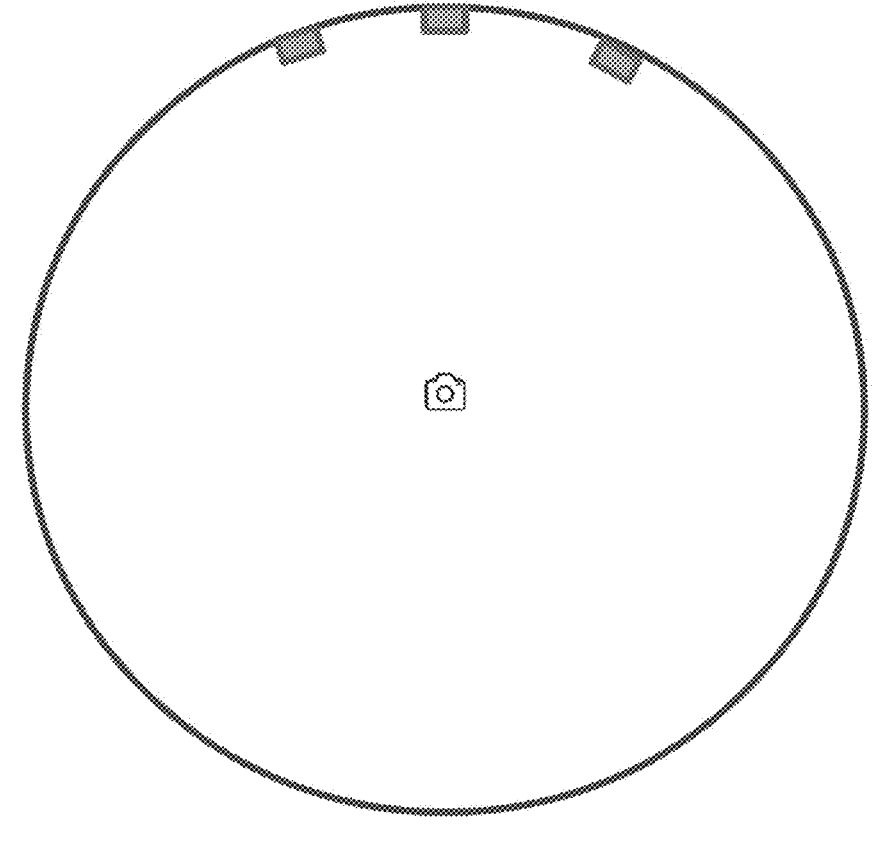
FIG. 6 is a layout figure of the home improvement materials placed on the wall projection plane provided by the present invention.

The rotation angle corresponding to the wall projection plane needs to be calculated. The specific calculation process is: assuming that the home improvement material is located directly in front of the camera, with the back against the reference wall projection plane, so that the front of the home improvement material is seen, which is defined as a front view. In fact, when translating the home improvement materials along the reference wall projection plane, the side can be seen slightly, which is, however, ignored in the graphic design process, and the movement along the reference wall projection plane is converted into an approximate movement along the arc wall. As shown in FIG. 6 below, the square home improvement materials attaching on the arc wall are all frontal poses at the camera position, and such materials will be displayed with the correct pose in the final rendering.

When considering the limit state that the left wall adjacent to the left of the reference wall is infinitely far away from the camera, the front view of the home improvement material is also seen. When the left wall is right in front of the camera, a 90° view of the left side of the home improvement material is seen, and when the left wall is at the general position, the observation angle of the home improvement material is determined according to the imaging angle of the left wall. The cosine value of the imaging angle $\theta$ of the left wall is equal to the ratio of the pixel length of the horizontal line per unit length projected on the left wall projection plane and the pixel length of the reference wall projection plane, so that the rotation angle $\theta$ corresponding to the wall projection plane can be determined. In particular, when the observed length is equal to the actual length, the ratio is 1, $\theta$ is 0, and when the observed length is 0, $\theta$ is 90°.

In another embodiment, when home improvement materials need to be placed at an angle adjusted, 360 degrees are rotated at an interval of unit rotation angle according to the user's choice;

When rotating, if the home improvement material is three-dimensional, replacing the home improvement material before the rotation with the home improvement material rendering at the target angle after rotation;

If the home improvement material is two-dimensional, predicting the image of the two-dimensional home improvement material at the target angle according to the pre-trained deep learning network, and the predicted image is used to replace the home improvement material before rotation.

During the design, the user can adjust the placement angle of the home improvement materials. When adjusting, each time when the user adjusts, angle rotates by a unit. The unit rotation angle can be set to any angle, for example, it can be set to 10 degrees, that is, the home improvement material is rotated at an interval of 10 degree until the user is satisfied. When the placement angle of the home improvement material changes, the presented view will also change. In order to enhance the design realism, it is necessary to replace the original presented state view with the state view presented after the home improvement material is transformed. For three-dimensional home improvement materials, since the material library contains the three-dimensional model of the three-dimensional home improvement materials, the three-dimensional model is directly rendered at the target angle (i.e. the angle after rotation) to obtain the rendered image of home improvement material at the target angle, and the rendered image of the home improvement materials will substitute for the home improvement materials before rotation.

For the two-dimensional home improvement materials without three-dimensional models, in order to obtain the two-dimensional home improvement materials at the target angle, a large number of two-dimensional home improvement materials from different angles are used as training samples to train the deep learning network so that the trained deep learning network can predict the image of the two-dimensional home improvement material at the target angle to obtain the predicted image, and the predicted image is used to replace the home improvement material before rotation. The deep learning network is a learning network that can realize image prediction. It can be composed of a convolutional layer, a pooling layer, and a fully connected layer. For example, it can be the VI-GAN (View Independent Generative Adversarial Network) from ICCV2019, TVSN (Transformation-grounded view synthesis network) from CVPR2017, or view synthesis via appearance flow from ECCV2016, which is not specifically limited here.

In the process of moving, following the mouse movement from the perspective before moving. When the left mouse button is lifted to confirm the target position, the view presented by the home improvement material is recalculated based on the target position.

In another embodiment, when the original home improvement material at the target position is replaced with the current home improvement material, the world coordinates of the target position and the placement angle information of the original home improvement material are retained, and the projection size of the current home improvement material is calculated.

In the design process, when the user is not satisfied with the home improvement materials placed at a certain target position, the materials can be replaced. In order to increase the replacement rate, when replacing the home improvement material, the world coordinates of the target position and the angle information of the original home improvement material remain unchanged, and it is only necessary to recalculate the projection size of the current home improvement material.

In another embodiment, when the home improvement material on the projection plane is scaled, the projection size of the home improvement material is directly scaled linearly. After the scaling is completed, the physical size corresponding to the scaled projection size is projected to the world coordinate system and saved.

In the design process, when the user is not satisfied with the projected size of the home improvement material, the home improvement material can be directly scaled. In order to increase the scaling rate, a simple and effective linear scale is directly used to adjust the projection size. After the adjustment, the physical size corresponding to the scaled projection size and the world coordinates corresponding to the physical size need to be saved.

FIG. 7 is a flowchart of another embodiment of the graphic home improvement design auxiliary method provided by the present invention. The graphic home improvement design auxiliary method shown in FIG. 7 is mainly aimed at the graphic home improvement design auxiliary method that takes the real-shot photos of the hard-installation of the house as the background image of the graphic home improvement. As shown in FIG. 7, the graphic home improvement design auxiliary method includes the following steps:

S701: Obtaining a real-shot photo of the hard-installation of the house as the background picture of the graphic home-improvement.

The graphic home improvement background image is a plan view that includes at least one projection plane of a floor projection plane, a wall projection plane, and a ceiling projection plane;

S702: Detecting plane intersection lines in the graphic home improvement background image to construct a three-dimensional model corresponding to the graphic home improvement background image.

Since the real-shot photos of the house's hard-installation are uploaded by the user and no 3D models exist, the home improvement materials need to be placed according to the three-dimensional space constraints during the design. Therefore, before placing the home-improvement materials, the user needs to construct three-dimensional models of the real-shot photos of the house's hard-installation. Specifically, a straight line detection method may be adopted to detect the plane intersection lines in the real-shot photo of the hard-installation of the house, so as to obtain the three-dimensional structure of the real-shot photo of the hard-installation of the house.

Of course, layout estimation algorithms can also be used, such as RoomNet specified in RoomNet: End-to-End Room Layout Estimation, CFILE specified in A Coarse-to-Fine Indoor Layout Estimation (CFILE) Method, and ST-PIO specified in Physics Inspired Optimization on Semantic Transfer Features: An Alternative Method for Room Layout Estimation, to estimate the three-dimensional structure of the real-shot photos of the hard-installation of the houses.

S703: Adding physical sizes according to the three-dimensional model, and determining camera parameters, depth information, and the transform matrix between the projection plane coordinate system and the world coordinate system.

On the basis of obtaining the three-dimensional model, the physical size of the three-dimensional model needs to be estimated. Adding the physical size to the three-dimensional model is an interactive process. The user modifies and determines the physical size automatically added by the system to determine the correct physical size. In addition, in order to facilitate subsequent rendering of the three-dimensional model, retrodicting the camera information and depth information based on physical dimensions.

For the real-shot photos of the hard-installation of the houses, select at least 6 points, any 3 of which are not collinear, to calculate the transform matrix between the projection plane coordinate system and the world coordinate system. Specifically, the user can select 6 points to calculate the transform matrix between the projection plane coordinate system and the world coordinate system. When there are more than 6 points selected, the selected points are grouped and the transformation matrix calculated by each group of points is averaged and used as the transformation matrix between the final projection plane coordinate system and the world coordinate system.

S704: Selecting the target position of the home improvement material on the graphic home improvement background map, placing the home improvement material at the target position according to the three-dimensional space constraint conditions corresponding to the type of home improvement material, and at the same time transforming the home improvement material from the physical size to the projected size according to the target position and depth information, so as to realize the auxiliary design of graphic home improvement.

The steps of S704 are the same as the steps of S103, and will not be repeated here.

In some embodiments, based on the completed graphic home improvement design, in order to obtain a realistic design result image, the design result may also be rendered to obtain a rendered image. Therefore, the graphic home improvement design auxiliary method further includes:

When the home improvement material is three-dimensional, the 3D model of each home improvement material is directly called, and placing the 3D model to the target position of the home improvement material in the 3D model corresponding to the graphic home improvement background image to obtain the 3D model of the scene, and then according to the camera parameters, rendering the 3D model of the scene to obtain the rendered image of the scene.

In some embodiments, the graphic home improvement design auxiliary method further includes:

When the home improvement material is two-dimensional, searching for a matching model that matches the home improvement material in the model library, and placing the matching model to the target position of the home improvement material in the 3D model corresponding to the graphic home improvement background image to obtain a 3D model of the scene. Then rendering the 3D model of the scene according to the camera parameters to obtain the rendered image of the scene;

When the model searched in the model library does not match the home improvement materials, the following two methods are used to deal with:

Method 1: Generating a flatbed 3D model from the outline of the home improvement material, adding material attributes according to the type of the home improvement material, and applying texture mapping on the surface of the flat panel in a manner that the home improvement materials align to obtain the processed flatbed 3D model. In the 3D model corresponding to the graphic home improvement background image, placing the processed flatbed 3D model at the target position of the home improvement material to obtain the 3D model of the scene, and then rendering the 3D model of the scene according to the camera parameters to obtain the rendered image of the scene.

Method 2: Abandoning the 2D home improvement materials directly, rendering the scene 3D model containing the 3D model of the 3D home improvement materials to obtain the rendered image of the scene, and subtracting the occluded part of the 2D home improvement materials according to the occlusion relationship of the scene rendering, and the rest of the part, i.e. the two-dimensional home improvement materials, are pasted on the scene rendering.

In the search process, firstly, calculating the similarity between all models in the model library and the home improvement materials, and arrange them in descending order of similarity; then, determining whether the model matches the home improvement materials according to the similarity between the searched model and the home improvement materials. When the similarity with the home improvement material is greater than the similarity threshold, the model is considered to be a model that matches the home improvement material; when the similarity between the model and the home improvement material is less than the similarity threshold, the model is considered to be mismatched with the home improvement material.

In some embodiments, when the user is not satisfied with the graphic home improvement design drawing using the graphic home improvement design auxiliary method provided by the above-mentioned embodiment, the graphic home improvement design drawing can be used as the graphic home improvement background image to redesign through above graphic home improvement design auxiliary method. The user can adjust the home improvement materials until the design result is satisfactory.

Among them, the graphic home improvement design drawing can be a design result obtained by directly placing home improvement materials on a graphic home improvement background image, or a rendered image obtained by mapping the design result to a three-dimensional space and then rendering it, or a rendered image obtained by directly rendering a general three-dimensional design scheme.

The graphic home improvement design auxiliary method provided by the above embodiment constructs a three-dimensional model of the graphic home improvement background image, and when placing home improvement materials on the graphic home improvement background image, auxiliary constraints are performed according to the type of the home improvement material and the three-dimensional space constraints to realize the automatic adjustment of the size, position and angle of the home improvement material, thus greatly improving the efficiency of home improvement design.

In addition, in the graphic home improvement design auxiliary method provided by the above embodiments, both the background and home improvement materials use graphic map, which can be compatible with both 2D home improvement materials and 3D home improvement materials at the same time. It is of strong universality, and greatly reduces the front-end computing pressure compared with 3D design. The user experience and interaction are more intuitive and easier to use. After the design is over, the 3D solution can be seamlessly connected to render, generating a more realistic photo-level rendering that is comparable to real light and shadow.

The specific embodiments described above elaborate the technical solutions and beneficial effects of the present invention in detail. It should be understood that the above descriptions are only the most preferred embodiments of the present invention and are not intended to limit the present invention. Any modifications, supplements and equivalent replacements made within the principal scope of the present invention shall be included in the protection scope of the present invention.

The invention claimed is:

1. A computer-implemented auxiliary method for graphic home improvement design, comprising the following steps:

acquiring by a camera a rendered image as a graphic home improvement background image, and at the same time acquiring camera parameters and depth information of the rendered image; wherein the graphic home improvement background image is a plan view that includes at least one projection plane of a floor projection plane, a wall projection plane, and a ceiling projection plane;

constructing a transform matrix between a projection plane coordinate system and a world coordinate system according to camera parameters, and constructing a three-dimensional model corresponding to the plane home improvement background image according to the transform matrix;

selecting a target position of a home improvement material on a graphic home improvement background map, placing the home improvement material at the target position according to three-dimensional space constraint conditions corresponding to a type of home improvement material, and at the same time transforming the home improvement material from a physical size to a projected size according to the target position and depth information, so as to realize an auxiliary design of graphic home improvement;

wherein the rendered image comprises a home improvement design rendered image with depth information, camera parameters and a blank scene rendered image;

for the rendered image with depth information and camera parameters, obtaining the camera parameters and depth information from the rendered image; then analyzing the rendering, separate soft decoration elements as design elements, and re-rendering the rest as the graphic home improvement background image;

using a blank scene rendered image as the graphic home improvement background image, using preset camera parameters and depth information;

wherein the three-dimensional space constraint conditions corresponding to the type of home improvement materials comprises:

for graphic home improvement materials, a corresponding three-dimensional space constraint condition is attached to the projection plane, and when the home improvement materials are placed, the home improvement materials are directly attached to the target position;

for placed 3D home improvement materials and suspended 3D home improvement materials, the corresponding three-dimensional space constraint is to be placed on the projection plane, and when such home improvement materials are placed, the home improvement material are directly placed in contact with the target position;

wherein the transforming of the home improvement material from physical size to projection size according to the target position and depth information comprises:

calculating world coordinates of home improvement materials according to the target position and depth information;

transforming the world coordinates of the home improvement materials to projection coordinates of the projection plane;

taking the target position of the home improvement material as a dividing line, taking the part of the home improvement material that increases the depth value along the depth direction as a sampling part, and sampling the different levels of pixel points along the depth direction according to the projection coordinates to reduce size;

taking the target position of the home improvement material as the dividing line, taking the part of the home improvement material that decreases the depth value along the depth direction as the interpolation part, and performing the interpolation of different levels of pixel points along the depth direction according to the projection coordinates in order to increase the size, transforming the home improvement material from physical size to projection size;

wherein the transforming of the world coordinates of the home improvement materials to the projection coordinates of the projection plane comprises:

method 1: according to the conversion matrix of the world coordinate system and the reference coordinate system, transforming the world coordinates of the home improvement materials to obtain the reference coordinates of the home improvement materials; then according to the perspective transform matrix between the reference coordinate system and the projection coordinate system, transforming the reference coordinates of the home improvement materials to obtain the projection coordinates of the home improvement materials; or, method 2: according to the transform matrix between the projection plane coordinate system and the world coordinate system, changing the world coordinates of the home improvement materials to obtain the projection coordinates of the home improvement materials;

wherein when home improvement materials need to be placed back against the wall projection plane, the projection on the close to the wall is automatically performed according to the rotation angle corresponding to the wall projection plane; the graphic home improvement materials are placed with a rotating back against the projection plane of the wall;

wherein when home improvement materials need to be placed at an angle adjusted, 360 degrees are rotated at an interval of unit rotation angle according to the user's choice;

when rotating, when the home improvement material is three-dimensional, the home improvement material before the rotation is replaced with the home improvement material rendering at the target angle after rotation;

when the home improvement material is two-dimensional, the predicted image of the two-dimensional home improvement material at the target angle is predicted according to a pre-trained deep learning network, and the predicted image is used to replace the home improvement material before rotation;

wherein when an initial home improvement material at the target position is replaced with the current home improvement material, the world coordinates of the target position and placement angle information of the initial home improvement material are retained, and the projected size of the current home improvement material is calculated;

wherein when the home improvement material on the projection plane is scaled, the projected size of the home improvement material is directly scaled linearly; after the scaling is completed, the physical size corresponding to the post-projection size is mapped to the world coordinate system and saved;

wherein the graphic home improvement design auxiliary method further comprises:

when the home improvement material is three-dimensional, the 3D model of each home improvement material is directly called, and the 3D model is placed to the target position of the home improvement material in the 3D model corresponding to the graphic home improvement background image to obtain the 3D model of the scene, and then according to the camera parameters, the 3D model of the scene is rendered to obtain the rendered image of the scene;

wherein the graphic home improvement design auxiliary method further comprises:

when the home improvement material is two-dimensional, searching for a matching model that matches the home improvement material in a model library, and placing the matching model to the target position of the home improvement material in a 3D model corresponding to the graphic home improvement background image to obtain a 3D model of a scene; then rendering the 3D model of the scene according to the camera parameters to obtain the rendered image of the scene;

when the model searched in the model library does not match the home improvement material, using the following two methods:

method 1: generating a flatbed 3D model from an outline of the home improvement material, adding material attributes according to the type of the home improvement material, and applying texture mapping on the surface of a flat panel in the manner of aligned the home improvement material to obtain the processed flatbed 3D model; in the 3D model corresponding to the graphic home improvement background image, placing the processed flatbed 3D model at the target position of the home improvement material to obtain the 3D model of the scene, and then rendering the 3D model of the scene according to the camera parameters to obtain the rendered image of the scene;

method 2: abandoning a 2D home improvement materials directly, rendering the scene 3D model containing the 3D model of the 3D home improvement materials to obtain the rendered image of the scene, and subtracting the occluded part of the 2D home improvement materials according to the occlusion relationship of the scene rendering, and pasting the rest of the part of the two-dimensional home improvement materials on the scene rendering.

2. The computer-implemented auxiliary method for graphic home improvement design of claim 1, further comprises:

when a user is dissatisfied with the graphic home improvement design drawing designed using the computer implemented auxiliary method for graphic home improvement design of claim 1, using the drawing as the graphic home improvement background image, and then using the computer-implemented auxiliary method for the graphic home improvement design in claim 1 to redesign and adjusting the home improvement materials until the user is satisfied with the results.

3. A computer-implemented assisting method of graphic home improvement design, comprising the following steps:

acquiring by a camera a real-shot photo of hard-installation of a house as a graphic home improvement background image, which is a plan view that includes at least one projection plane of a floor projection plane, a wall projection plane, and a ceiling projection plane;

detecting plane intersection lines in the graphic home improvement background image to construct a three-dimensional model corresponding to the graphic home improvement background image;

adding physical dimensions according to the three-dimensional model, and determining camera parameters, depth information, and transform matrix between a projection plane coordinate system and a world coordinate system;

selecting a target position of a home improvement material on a graphic home improvement background map, placing the home improvement material at the target position according to a three-dimensional space constraint conditions corresponding to a type of home improvement material, and at the same time transforming the home improvement material from a physical size to a projected size according to the target position and depth information, so as to realize an auxiliary design of graphic home improvement;

wherein the three-dimensional space constraint conditions corresponding to the type of home improvement materials comprises:

for graphic home improvement materials, a corresponding three-dimensional space constraint condition is attached to the projection plane, and when the home improvement materials are placed, the home improvement materials are directly attached to the target position;

for placed 3D home improvement materials and suspended 3D home improvement materials, the corresponding three-dimensional space constraint is to be placed on the projection plane, and when such home improvement materials are placed, the home improvement material are directly placed in contact with the target position;

wherein the transforming of the home improvement material from physical size to projection size according to the target position and depth information comprises:

calculating world coordinates of home improvement materials according to the target position and depth information;

transforming the world coordinates of the home improvement materials to projection coordinates of the projection plane;

taking the target position of the home improvement material as a dividing line, taking the part of the home improvement material that increases the depth value along the depth direction as a sampling part, and sampling the different levels of pixel points along the depth direction according to the projection coordinates to reduce size;

taking the target position of the home improvement material as the dividing line, taking the part of the home improvement material that decreases the depth value along the depth direction as the interpolation part, and performing the interpolation of different levels of pixel points along the depth direction according to the projection coordinates in order to increase the size, transforming the home improvement material from physical size to projection size;

wherein the transforming of the world coordinates of the home improvement materials to the projection coordinates of the projection plane comprises:

method 1: according to the conversion matrix of the world coordinate system and the reference coordinate system, transforming the world coordinates of the home improvement materials to obtain the reference coordinates of the home improvement materials; then according to the perspective transform matrix between the reference coordinate system and the projection coordinate system, transforming the reference coordinates of the home improvement materials to obtain the projection coordinates of the home improvement materials; or, method 2: according to the transform matrix between the projection plane coordinate system and the world coordinate system, changing the world coordinates of the home improvement materials to obtain the projection coordinates of the home improvement materials;

wherein when home improvement materials need to be placed back against the wall projection plane, the projection on the close to the wall is automatically performed according to the rotation angle corresponding to the wall projection plane; the graphic home improvement materials are placed with a rotating back against the projection plane of the wall;

wherein when home improvement materials need to be placed at an angle adjusted, 360 degrees are rotated at an interval of unit rotation angle according to the user's choice;

when rotating, when the home improvement material is three-dimensional, the home improvement material before the rotation is replaced with the home improvement material rendering at the target angle after rotation;

when the home improvement material is two-dimensional, the predicted image of the two-dimensional home improvement material at the target angle is predicted according to a pre-trained deep learning network, and the predicted image is used to replace the home improvement material before rotation;

wherein when an initial home improvement material at the target position is replaced with the current home improvement material, the world coordinates of the target position and placement angle information of the initial home improvement material are retained, and the projected size of the current home improvement material is calculated;

wherein when the home improvement material on the projection plane is scaled, the projected size of the home improvement material is directly scaled linearly; after the scaling is completed, the physical size corresponding to the post-projection size is mapped to the world coordinate system and saved;

wherein the graphic home improvement design auxiliary method further comprises:

when the home improvement material is three-dimensional, the 3D model of each home improvement material is directly called, and the 3D model is placed to the target position of the home improvement material in the 3D model corresponding to the graphic home improvement background image to obtain the 3D model of the scene, and then according to the camera parameters, the 3D model of the scene is rendered to obtain the rendered image of the scene;

wherein the graphic home improvement design auxiliary method further comprises:

when the home improvement material is two-dimensional, searching for a matching model that matches the home improvement material in a model library, and placing the matching model to the target position of the home improvement material in a 3D model corresponding to the graphic home improvement background image to obtain a 3D model of a scene; then rendering the 3D model of the scene according to the camera parameters to obtain the rendered image of the scene;

when the model searched in the model library does not match the home improvement material, using the following two methods:

method 1: generating a flatbed 3D model from an outline of the home improvement material, adding material attributes according to the type of the home improvement material, and applying texture mapping on the surface of a flat panel in the manner of aligned the home improvement material to obtain the processed flatbed 3D model; in the 3D model corresponding to the graphic home improvement background image, placing the processed flatbed 3D model at the target position of the home improvement material to obtain the 3D model of the scene, and then rendering the 3D model of the scene according to the camera parameters to obtain the rendered image of the scene;

method 2: abandoning a 2D home improvement materials directly, rendering the scene 3D model containing the 3D model of the 3D home improvement materials to obtain the rendered image of the scene, and subtracting the occluded part of the 2D home improvement materials according to the occlusion relationship of the scene rendering, and pasting the rest of the part of the two-dimensional home improvement materials on the scene rendering.

* * * * *